US010268103B2

(12) United States Patent
Wada et al.

(10) Patent No.: US 10,268,103 B2
(45) Date of Patent: *Apr. 23, 2019

(54) CAMERA DEVICE AND CAMERA DEVICE CONTROL METHOD

(71) Applicant: PANASONIC INTELLECTUAL PROPERTY MANAGEMENT CO., LTD., Osaka (JP)

(72) Inventors: Jyouji Wada, Kanagawa (JP); Yoshihito Urashima, Fukuoka (JP); Masahito Oka, Fukuoka (JP); Nobuhito Seki, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/327,231

(22) PCT Filed: Aug. 28, 2015

(86) PCT No.: PCT/JP2015/004343
§ 371 (c)(1),
(2) Date: Jan. 18, 2017

(87) PCT Pub. No.: WO2016/038831
PCT Pub. Date: Mar. 17, 2016

(65) Prior Publication Data
US 2017/0261836 A1 Sep. 14, 2017

(30) Foreign Application Priority Data
Sep. 12, 2014 (JP) .................. 2014-186487

(51) Int. Cl.
G03B 11/04 (2006.01)
G03B 17/56 (2006.01)
(Continued)

(52) U.S. Cl.
CPC .......... *G03B 11/045* (2013.01); *G03B 11/043* (2013.01); *G03B 17/561* (2013.01); *H04N 5/225* (2013.01); *H01L 27/14623* (2013.01)

(58) Field of Classification Search
CPC .... H04N 5/225; G03B 11/045; G03B 17/561; H01L 27/14623
See application file for complete search history.

(56) References Cited

U.S. PATENT DOCUMENTS 8,899,849 B2   12/2014 Wada et al.
2013/0169805 A1*  7/2013 Park ................. G08B 13/19619
                                                           348/143

(Continued)

FOREIGN PATENT DOCUMENTS

JP       2012-103452         5/2012

OTHER PUBLICATIONS

Search Report issued in International Application No. PCT/JP2015/004343, dated Oct. 13, 2015.

*Primary Examiner* — Ahmed A Berhan
(74) *Attorney, Agent, or Firm* — Greenblum & Bernstein, P.L.C.

(57) ABSTRACT

According to the invention, there is provided a camera device including a light transmitting cover, a rotatable camera unit that is provided in the cover, a light shielding plate unit that can move the positions of a plurality of light shielding plates each of which blocks a portion of light incident on the camera unit, and a control unit that controls the light shielding plate unit, in which the control unit changes a light shielding range of each of the plurality of light shielding plates according to a tilt angle of the camera unit.

11 Claims, 16 Drawing Sheets

(51) Int. Cl.
*H04N 5/225* (2006.01)
*H01L 27/146* (2006.01)

(56) References Cited

U.S. PATENT DOCUMENTS

| | | |
|---|---|---|
| 2013/0223834 A1 | 8/2013 | Jikihara et al. |
| 2014/0248045 A1* | 9/2014 | Wada .................. G03B 17/561 |
| | | 396/427 |
| 2014/0333767 A1 | 11/2014 | Jikihara et al. |
| 2015/0268534 A1 | 9/2015 | Jikihara et al. |

* cited by examiner

CAMERA DEVICE AND CAMERA DEVICE CONTROL METHOD

TECHNICAL FIELD

The present invention relates to a camera device which has a function of rotating in a panning direction and a tilting direction and which is covered by a semispherical transparent cover and a camera device control method.

BACKGROUND ART

In the related art, a camera device such as a surveillance camera generally performs image capturing while rotating a camera lens in a panning direction and a tilting direction (for example, refer to Japanese Patent Unexamined Publication No. 2012-103452).

CITATION LIST

Patent Literature

PTL 1: Japanese Patent Unexamined Publication No. 2012-103452

SUMMARY OF THE INVENTION

However, in a dome type camera in the related art, a partial light shielding filter can be disposed only in an insertion position and a withdrawal position, and a light shielding rate cannot be changed flexibly according to a tilt angle, a zoom magnification, and various installation environments (brightness or the like).

An object of the invention is to provide a camera device and a camera device control method in which a light shielding rate can be changed flexibly according to a tilt angle, a zoom magnification, and various installation environments (brightness or the like).

According to the invention, there is provided a camera device including a light transmitting cover, a rotatable camera unit that is provided in the cover, a light shielding plate unit that can move the positions of a plurality of light shielding plates each of which blocks a portion of light incident on the camera unit, and a control unit that controls the light shielding plate unit, in which the control unit changes a light shielding range of each of the plurality of light shielding plates according to a tilt angle of the camera unit.

In addition, according to the invention, there is provided a camera device including a light transmitting cover, a rotatable camera unit that is provided in the cover, a light shielding plate unit that can move the positions of a first light shielding plate and a second light shielding plate each of which blocks a portion of light incident on the camera unit, and a control unit that controls the light shielding plate unit, in which the control unit sets light shielding ranges of the plurality of light shielding plates to be substantially the same in a case where a tilt angle of the camera unit is close to a zenith direction and sets a light shielding range of an upper light shielding plate to be larger than a light shielding range of a lower light shielding plate in a case where the tilt angle of the camera unit is close to a horizontal direction.

In addition, in the camera device of the invention, the cover may have a spherical shape.

Furthermore, in the camera device of the invention, the camera unit may be capable of rotating in a tilting direction and an axis of the rotation in the tilting direction may be offset from a spherical center of the cover in the zenith direction.

In addition, in the camera device of the invention, the plurality of light shielding plates may be arranged in a vertical direction with respect to an optical axis of the camera unit.

In addition, in the camera device of the invention, the plurality of light shielding plates are may be arc-shaped.

In addition, according to the invention, there is provided a camera device control method including a step of controlling a light shielding plate unit that can move the positions of a plurality of light shielding plates each of which blocks a portion of light incident on a rotatable camera unit provided in a light transmitting cover and a step of changing a light shielding range of each of the plurality of light shielding plates according to a tilt angle of the camera unit.

In addition, according to the invention, there is provided a camera device control method including a step of controlling a light shielding plate unit that can move the positions of a first light shielding plate and a second light shielding plate each of which blocks a portion of light incident on a rotatable camera unit provided in a light transmitting cover and a step of controlling light shielding ranges of the first light shielding plate and the second light shielding plate to be substantially the same in a case where a tilt angle of the camera unit is close to a zenith direction and setting a light shielding range of an upper light shielding plate to be larger than a light shielding range of a lower light shielding plate in a case where the tilt angle of the camera unit is close to a horizontal direction.

In the invention, the camera unit and the light shielding plate unit are covered by the light transmitting cover. The cover has a shape in which a transmission angle on one side of the optical axis of the camera unit and a transmission angle on the other side of the optical axis become different from each other when the camera unit rotates around a second rotation shaft. For this reason, a focal length of a transmitted light ray on the one side of the optical axis and a focal length of a transmitted light ray on the other side of the optical axis become different from each other and thus images overlap with each other and blurring occurs. Therefore, it is possible to provide a camera device and a camera device control method, which are capable of preventing images from overlapping with each other and capable of improving the image quality since a transmitted light ray on one side or the other side of an optical axis of a camera unit is blocked by appropriately rotating light shielding plates using a light shielding plate driving unit in the camera device and the camera device control method.

DESCRIPTION OF EMBODIMENTS

First Exemplary Embodiment

Hereinafter, a camera device and a camera device control method according to a first exemplary embodiment of the invention will be described with reference to the drawings.

Figure 1:
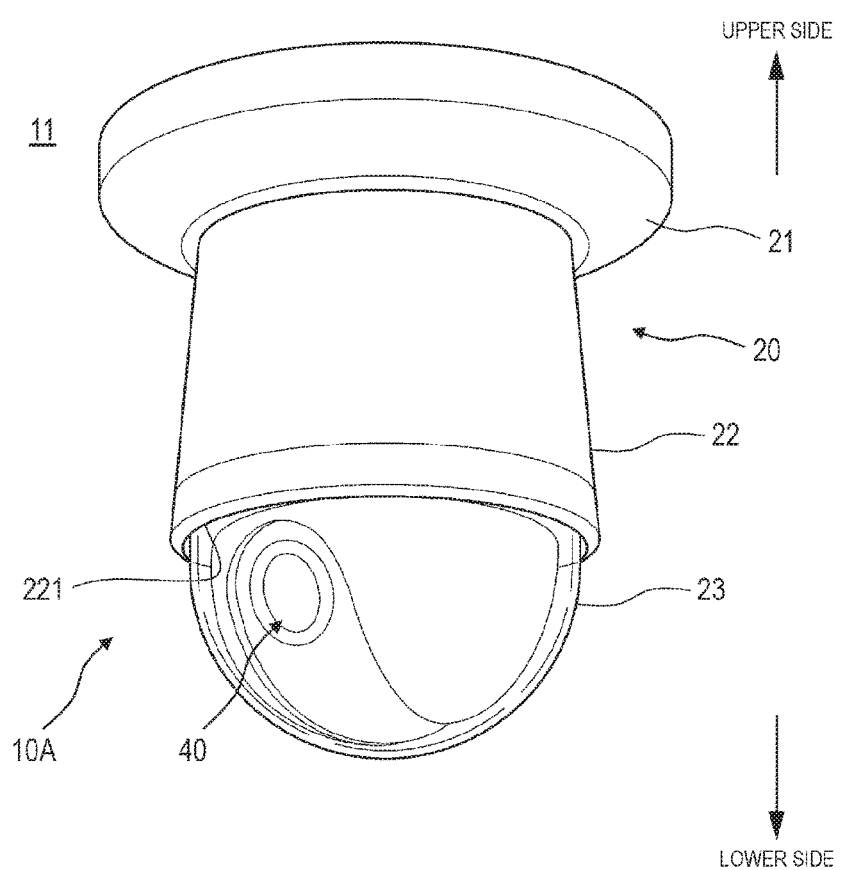
FIG. 1 is a perspective view illustrating the entire portion of a camera device according to a first exemplary embodiment of the invention as seen from below.

As illustrated in FIG. 1, as camera device 10A according to an exemplary embodiment of the invention, for example, a surveillance camera which is attached to a top surface 11 as an attachment surface and is capable of monitoring 360 degrees below top surface 11 can be used.

Note that, in the following description, top surface 11 side is referred to as the upper side and a side opposite to top surface 11 is referred to as the lower side.

Camera device 10A includes main body 20 which can be attached to top surface 11. Main body 20 includes disk-shaped base 21 which is attached to top surface 11, substantially cylindrical accommodation portion 22 which is attached to the lower side of base 21, and semispherical light transmitting cover 23 which covers opening 221 of accommodation portion 22. Inside cover 23, camera unit 40 is accommodated.

Figure 2:
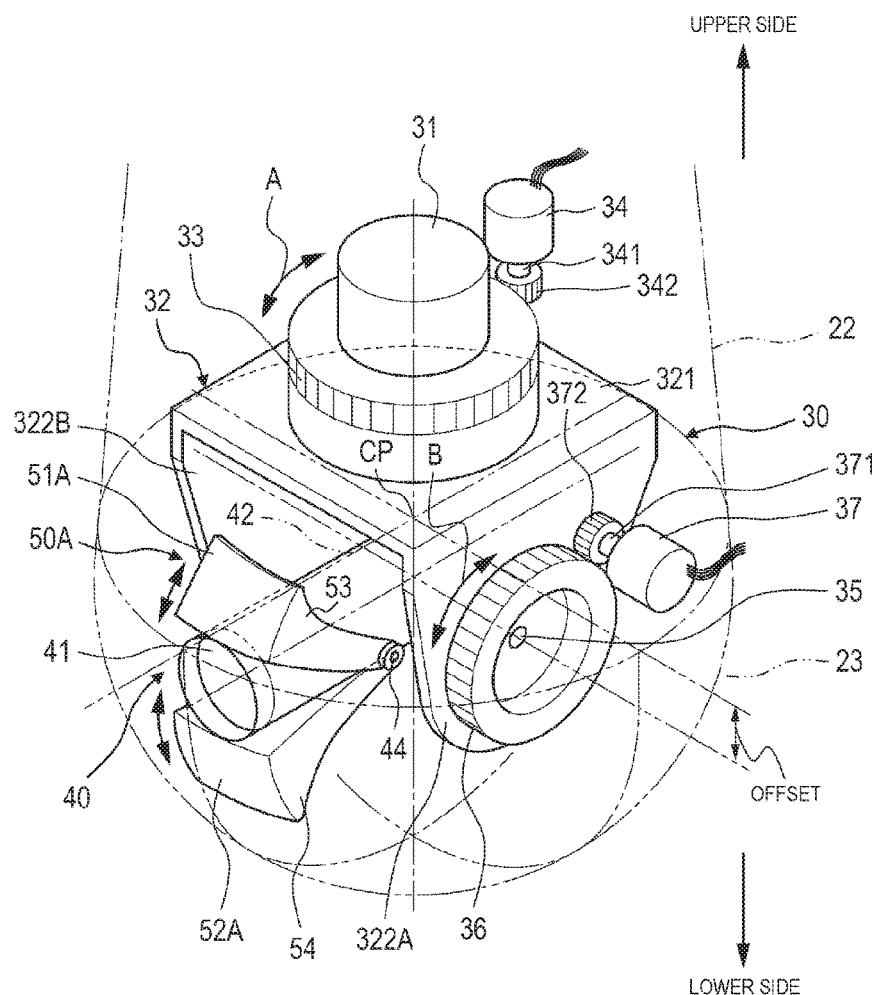
FIG. 2 is a perspective view illustrating a mechanism accommodated in a main body of the camera device according to the first exemplary embodiment of the invention as seen from above.

As illustrated in FIG. 2, in main body 20, internal mechanism 30 is accommodated. Internal mechanism 30 accommodated in accommodation portion 22 of main body 20 includes first rotation shaft 31 which is accommodated in accommodation portion 22 and is orthogonal to top surface 11.

Supporting member 32 which can rotate relative to main body 20 along arrow A direction around first rotation shaft 31 is attached to a lower end portion of first rotation shaft 31. An upper end portion of first rotation shaft 31 is fixed to base 21 or an upper portion of accommodation portion 22.

Supporting member 32 has a U-like shape as a whole and supporting member 32 includes top plate 321 and a pair of facing side plates 322A and 322B which extend downward from top plate 321. In the vicinity of first rotation shaft 31 above top plate 321, gear unit 33 which has a larger diameter than first rotation shaft 31 is provided to rotate integrally with supporting member 32.

First motor 34 is attached to accommodation portion 22 of main body 20. Gear 342 which meshes with gear unit 33 is attached to rotation shaft 341 of first motor 34.

Accordingly, gear unit 33 is rotated by first motor 34 and supporting member 32 is rotated along arrow A direction shown in FIG. 2.

Second rotation shaft 35 which is orthogonal to first rotation shaft 31 is provided for each of the pair of side plates 322A and 322B of supporting member 32 such that second rotation shaft 35 can rotate relative to supporting member 32. Between the pair of second rotation shafts 35, one camera unit 40 is provided.

Accordingly, camera unit 40 can rotate relative to side plates 322A and 322B integrally with the pair of second rotation shafts 35. Second rotation shaft 35 is provided horizontally in a position deviated (offset) from center CP of cover 23. A distal end of one second rotation shaft 35 is provided with gear unit 36. Gear unit 36 rotates integrally with second rotation shaft 35.

Second motor 37 is attached to supporting member 32. Gear 372 which meshes with gear unit 36 is attached to rotation shaft 371 of second motor 37. Gear unit 36 is controlled by second motor 37 and camera unit 40 is rotated upward and downward along a vertical plane (refer to arrow B).

Figure 3:
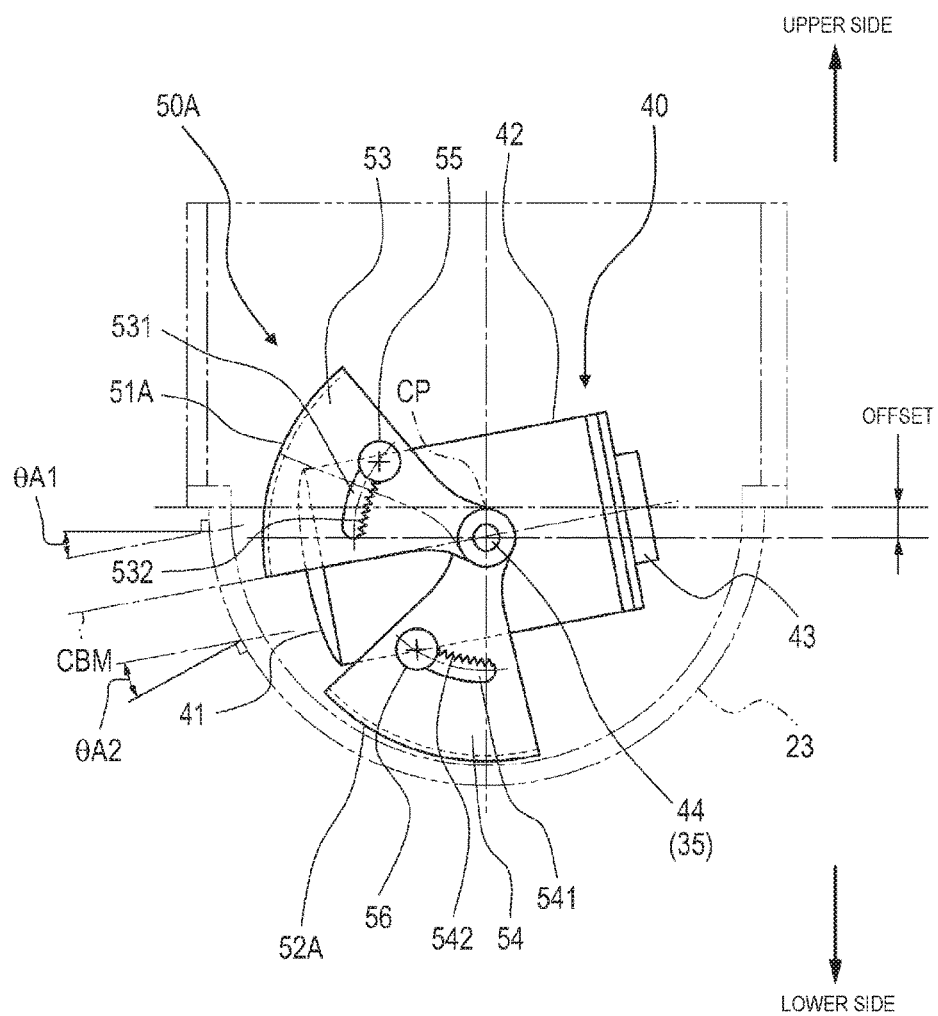
FIG. 3 is a side view illustrating a camera unit and a light shielding plate unit.

As illustrated in FIG. 2 and FIG. 3, camera unit 40 includes cylindrical body 42 accommodating lens 41 therein and imaging element 43 in which light transmitted through cylindrical body 42 forms an image and is converted into an electric signal. On each of opposite side surfaces of cylindrical body 42, third rotation shaft 44 is provided to protrude toward the outside.

A pair of third motor (a light shielding plate driving unit) 55 and fourth motor (a light shielding plate driving unit) 56 are attached to outer portions in the horizontal direction of cylindrical body 42. A gear (not shown) is mounted on a rotation shaft of third motor 55.

Light shielding plate unit 50A is attached to a front surface (on a subject side) of cylindrical body 42. Light shielding plate unit 50A includes light shielding plates 51A and 52A which are curved to have a partial arc shape. Opposite ends in a width direction of light shielding plates 51A and 52A are supported by a pair of facing fan-shaped supporting plates 53 and 54, respectively. Supporting plates 53 and 54 are rotatably supported by third rotation shaft 44 at the center position of the fan-like shape thereof.

As illustrated in FIG. 3, one supporting plate 53 and one supporting plate 54 are provided with arc-shaped long holes 531 and 541 extending around third rotation shaft 44, respectively. Gear 532 which meshes with the gear mounted on third motor 55 is provided one surface of long hole 531 which is close to the center side and gear 542 which meshes with a gear mounted on fourth motor 56 is provided one surface of long hole 541 which is close to the center side.

Accordingly, when third motor 55 is rotated, light shielding plate 51A rotates between a covering state in which light shielding plate 51A covers a portion of the front of lens 41 of camera unit 40 (a state as illustrated in FIG. 3) and a withdrawal state in which light shielding plate 51A is withdrawn from the front of lens 41.

Similarly, when fourth motor 56 is rotated, light shielding plate 52A rotates between a covering state in which light shielding plate 52A covers a portion of the front of lens 41 of camera unit 40 and a withdrawal state in which light shielding plate 52A is withdrawn from the front of lens 41 (a state as illustrated in FIG. 3).

Camera unit 40 and light shielding plate unit 50A are covered by light transmitting cover 23 which is attached to main body 20.

Here, as illustrated in FIG. 3, cover 23 has a shape in which transmission angle θA1 of a portion above optical axis CBM (one side) of camera unit 40 and transmission angle θA2 of a portion below optical axis CBM (the other side) become different from each other when camera unit 40 rotates around second rotation shaft 35. Here, for example, cover 23 may have a semispherical shape.

Next, operations of light shielding plates 51A and 52A will be described.

Figure 4A:
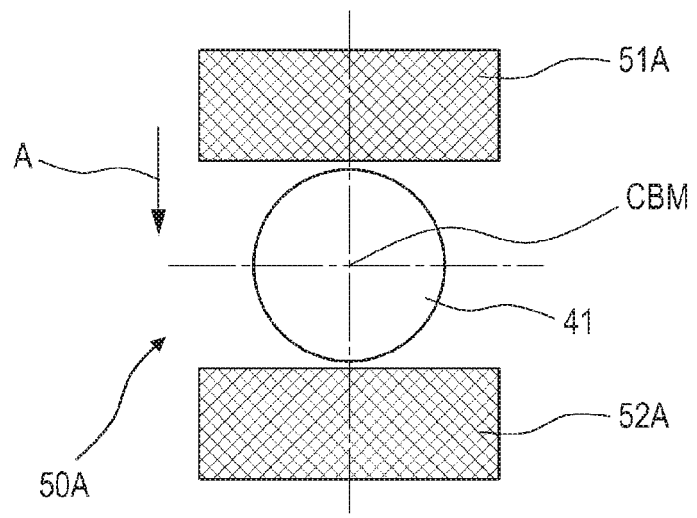
FIG. 4A is a front view illustrating light shielding plates of the camera device according to the first exemplary embodiment of the invention which are in a withdrawal state.

As illustrated in FIG. 4A, in the withdrawal state, light shielding plate 51A is positioned above lens 41 and light shielding plate 52A is positioned below lens 41. In this state, none of light shielding plates 51A and 52A cover the front of lens 41.

When transitioning into the covering state, light shielding plate 51A or light shielding plate 52A is caused to approach to optical axis CBM. Note that, in the following description, a case of lowering light shielding plate 51A will be described (refer to arrow A in FIG. 4A).

Figure 4B:
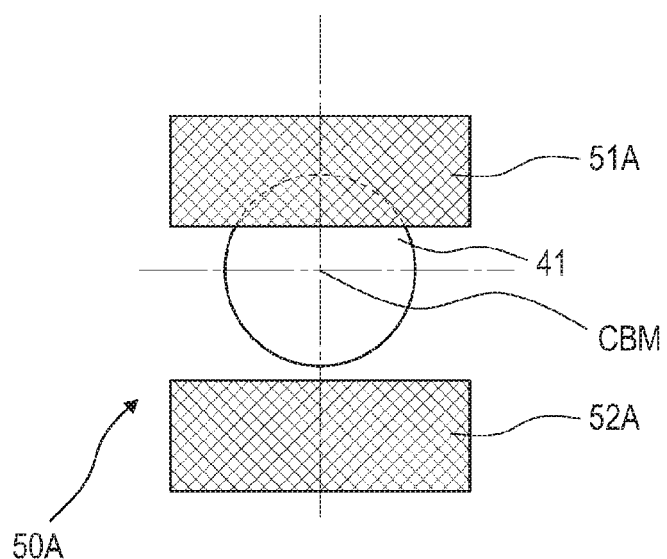
FIG. 4B is a front view illustrating the light shielding plates of the camera device according to the first exemplary embodiment of the invention which are in a covering state.

As a result of this, as illustrated in FIG. 4B, light shielding plate 51A covers an upper area, which is on one side of optical axis CBM of lens 41, thereby achieving the covering state.

Note that, the covering state may be achieved by covering a lower area, which is on the other side of the optical axis CBM of lens 41, using light shielding plate 52A.

Figure 5:
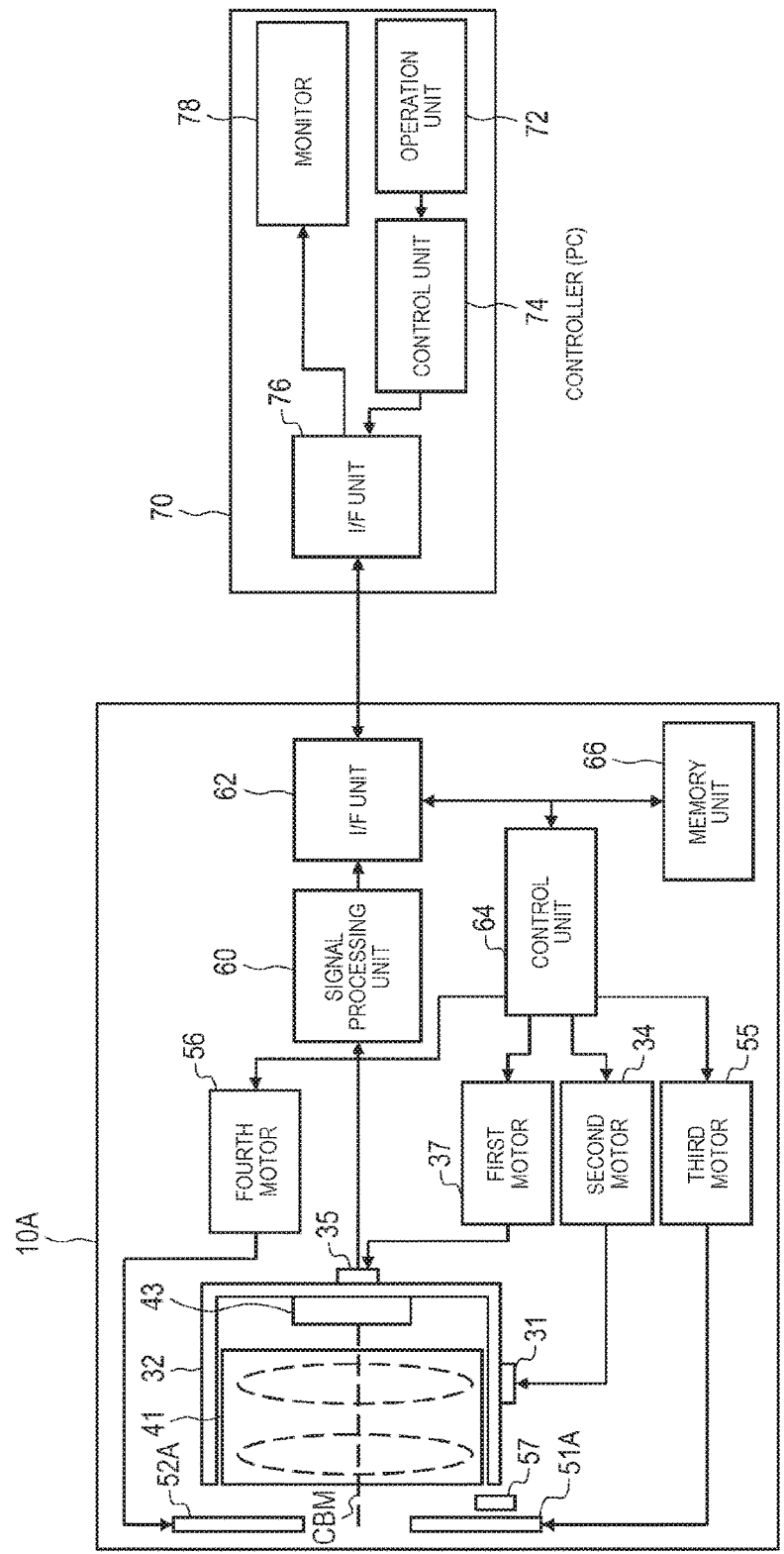
FIG. 5 is a block diagram of a camera system according to the first exemplary embodiment of the invention.

In addition, as illustrated in FIG. 5, starting point sensor 57 for light shielding plate 51A is provided behind (a direction opposite to the subject) light shielding plate unit 50A. Starting point sensor 57 can detect any of light shielding plate 51A in the withdrawal state and supporting plate 53 in the withdrawal state.

Starting point sensor 57 is connected to control unit 64 (which will be described later) and detects that light shielding plate 51A is positioned on the starting point.

Therefore, accurate positioning of light shielding plate 51A can be performed and the light shielding rate can be controlled at high accuracy. Here, in the covering state of lens 41 which is achieved using light shielding plate 51A or light shielding plate 52A, unlike in a general diaphragm of a lens in which the entire circumferential portion of an opening portion on which light is incident is shielded from light, a portion of the circumferential portion is shielded from light and the other portion of the circumferential portion is not shielded from light.

In addition, camera device 10 includes signal processing unit 60, I/F unit 62, control unit 64, and memory unit 66.

Signal processing unit 60 performs image signal processing such as gamma correction and gain correction on a signal from imaging element 43 and outputs the signal to I/F unit 62. I/F unit 62 is connected to external controller (PC) 70 via a network, transmits an image signal from signal processing unit 60 and transmits a control signal from controller (PC) 70 to control unit 64.

Meanwhile, controller (PC) 70 is provided with operation unit 72, control unit 74, I/F unit 76, and monitor 78. I/F unit 76 is connected to I/F unit 62 of camera device 10A via a network, receives an image signal from camera device 10A, and outputs the image signal to monitor 78. Monitor 78 outputs the image signal, which monitor 78 receives via I/F unit 76, to a screen. In addition, operation unit 72 inputs a signal for remotely controlling the positions of light shielding plates 51A and 52A. Control unit 74 receives and analyses a signal from operation unit 72 and transmits a control signal for controlling light shielding plates 51A and 52A to camera device 10A via I/F unit 76.

In this manner, controller (PC) 70 controls the posture of camera unit 40 by controlling the angle at which camera unit 40 is inclined in a panning direction and the angle at which camera unit 40 is inclined in a tilting direction. In addition, the light shielding rate is adjusted by controlling the positions of light shielding plates 51A and 52A.

First motor 34, second motor 37, third motor 55 and fourth motor 56 are controlled by control unit 64. In this manner, control unit 64 controls rotation of supporting member 32, rotation of camera unit 40 relative to supporting member 32, and the state of light shielding plates 51A and 52A.

Next, an image, which is captured in the covering state in which a portion of the front surface of lens 41 is covered by light shielding plate unit 50A, will be described.

Figure 6:
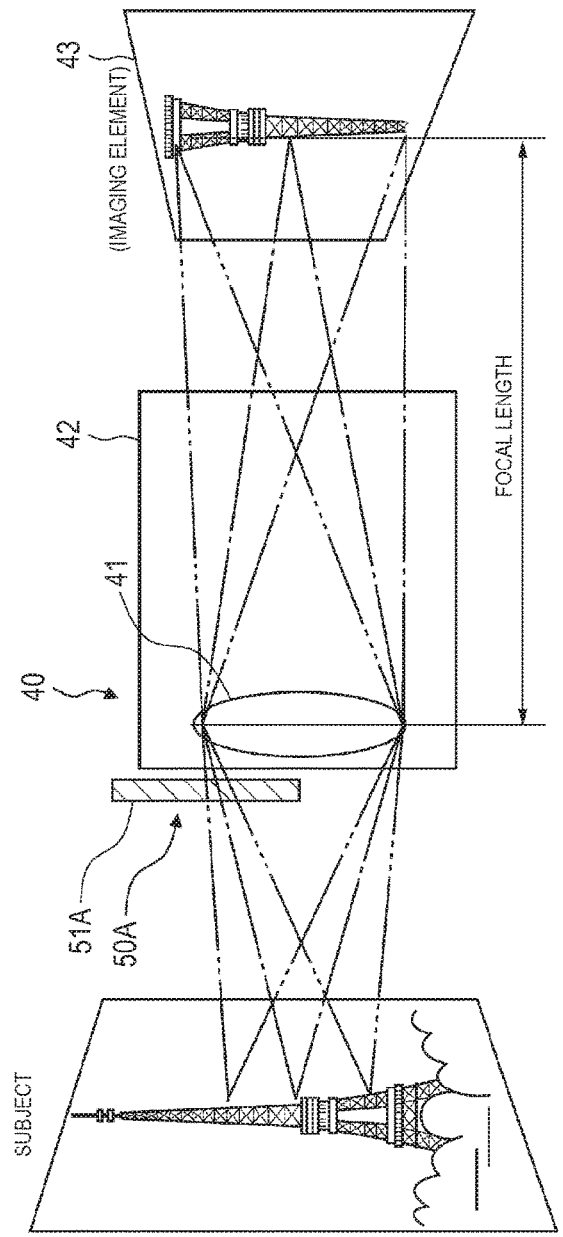
FIG. 6 is an explanatory diagram illustrating an image in a state where a portion of a front surface of a telescopic lens is covered.

As illustrated in FIG. 6, when the magnification of lens 41 is set for a telescopic mode, even when an upper end portion of lens 41 is covered by light shielding plate 51A, although there is a decrease in total light amount, light from the subject reaches to imaging element 43 through a lower end portion of lens 41 which is not covered by light shielding plate 51A. Therefore, there is no image defect.

Figure 7:
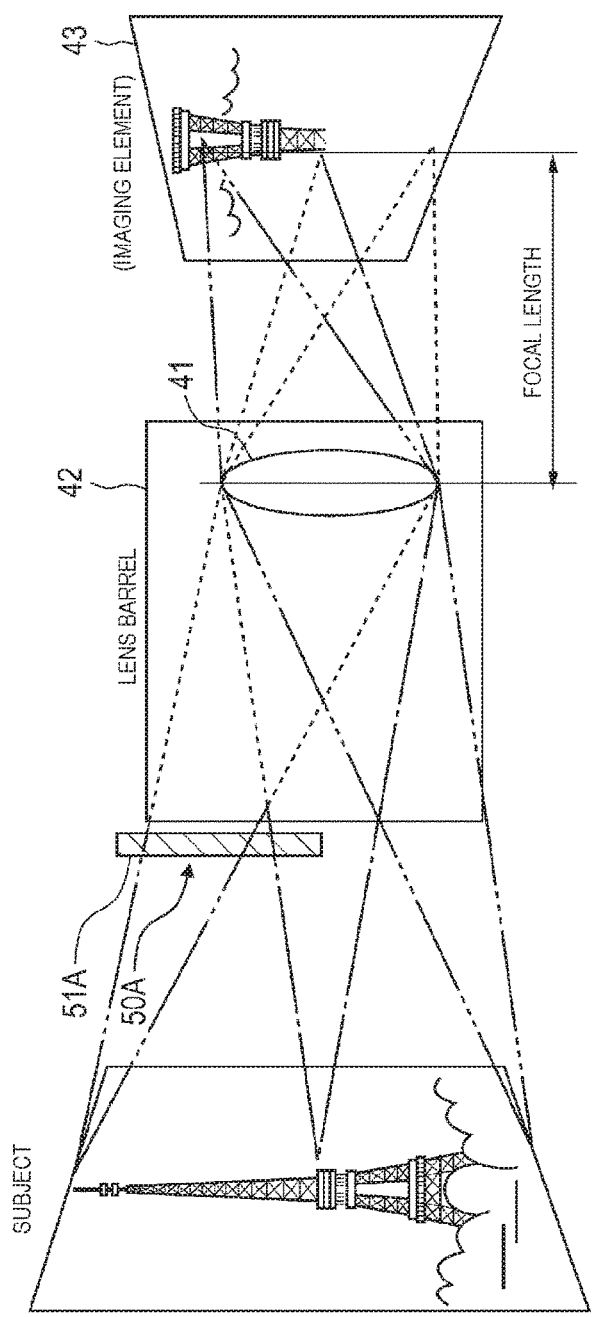
FIG. 7 is an explanatory diagram illustrating an image in a state where a portion of a front surface of a wide angle lens is covered.

Meanwhile, as illustrated in FIG. 7, in a case where the magnification of the lens 41 is set for a wide angle mode, when the upper end portion of lens 41 is covered by light shielding plate 51A, light from an upper portion of the subject is blocked by light shielding plate 51A and cannot reach imaging element 43. Therefore, the image defect (illustrated by dotted lines in FIG. 7) occurs.

Next, an operation effect of camera device 10A according to the first exemplary embodiment of the invention will be described.

Figure 15:
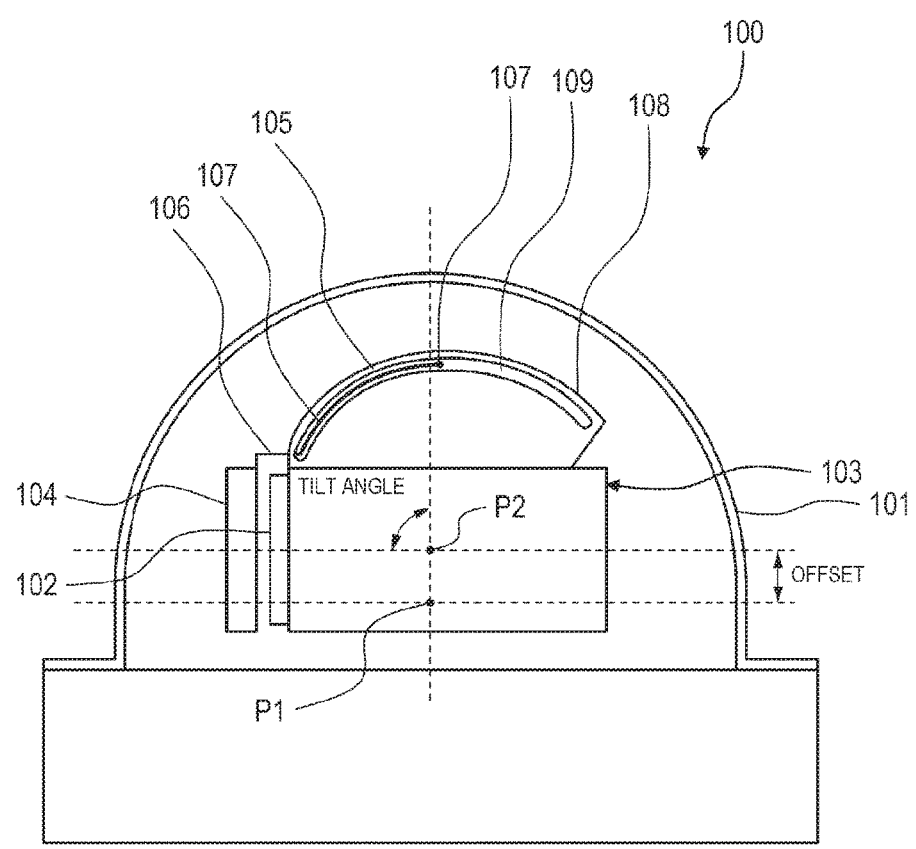
FIG. 15 is an explanatory diagram schematically illustrating a configuration of an optical system in a CCD camera which is mounted in a surveillance camera in the related art.
Figure 16A:
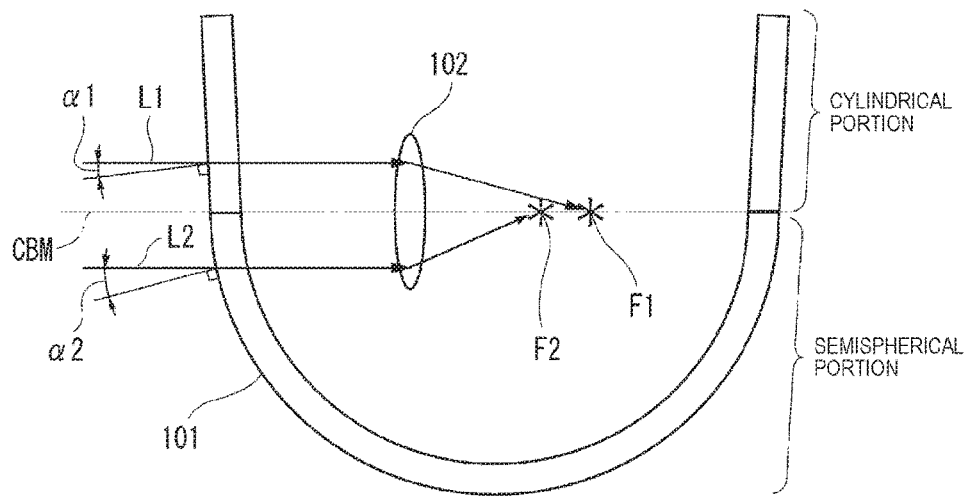
FIG. 16A is an explanatory diagram illustrating a case where images overlap with each other due to a difference in transmission angle between light rays transmitted through the cover, which travel above and below the optical axis, respectively.
Figure 16B:
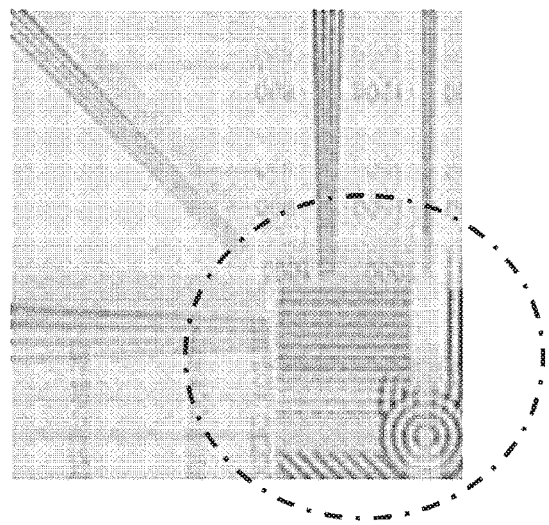
FIG. 16B is an explanatory diagram for explaining a state where displayed images overlap with each other according to FIG. 16A.
Figure 17:
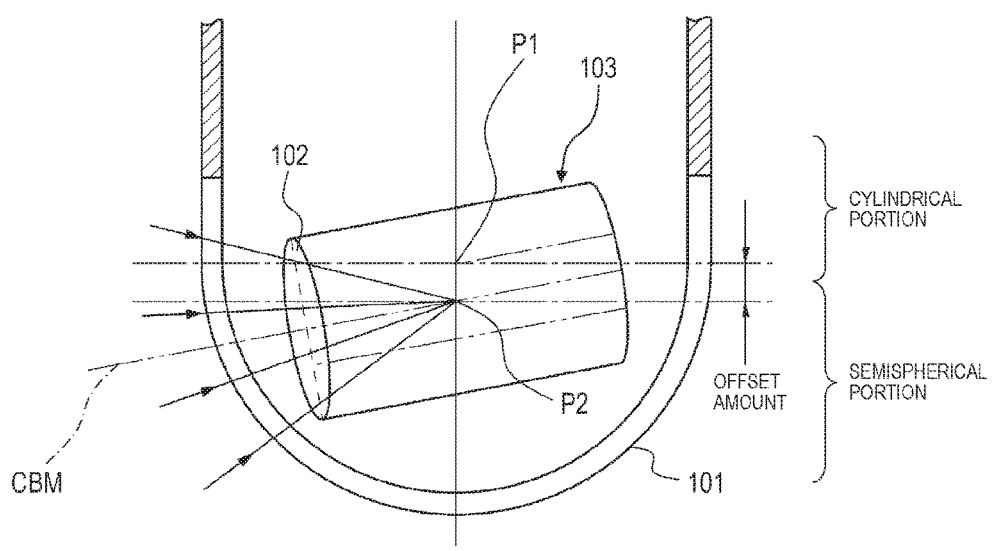
FIG. 17 is a sectional view illustrating light rays transmitted through a semispherical cover of a camera device in the related art.

FIG. 15 is an explanatory diagram schematically illustrating a configuration of an optical system in a CCD camera which is mounted in a surveillance camera in the related art. FIG. 16A is an explanatory diagram illustrating a case where images overlap with each other due to a difference in transmission angle between light rays transmitted through the cover, which travel above and below the optical axis, respectively. FIG. 16B is an explanatory diagram for explaining a state where displayed images overlap with each other according to FIG. 16A. FIG. 17 is a sectional view illustrating light rays transmitted through a semispherical cover of a camera device in the related art.

As illustrated in FIG. 15, dome type camera 100 includes semispherical dome cover 101. Inside dome cover 101, lens unit 103 which includes camera lens 102 is accommodated. Dome type camera 100 is provided with a panning motor and a tilting motor and lens unit 103 can rotate in the panning direction and the tilting direction.

Lens unit 103 is provided with partial light shielding filter 104. Arc-shaped guiding unit 105 is provided on an end portion of partial light shielding filter 104 via supporting piece 106. On each of right and left side surfaces of guiding unit 105, two guiding pins 107 are provided to protrude therefrom. Above lens unit 103, a pair of right and left guiding plates 108 are provided. Guiding pin 107 of guiding unit 105 is slidably inserted into arc-shaped long hole 109 which is provided in guiding plate 108.

In such dome type camera 100, as illustrated in FIG. 16A, for dome cover 101, a cylindrical portion is provided above a semispherical portion for connection with the accommodation portion. Therefore, in a case where the angle at which lens unit 103 is inclined is close to the horizontal line, transmission angle α1 of light ray L1 which is transmitted through dome cover 101 traveling above optical axis CBM is different from transmission angle α2 of light ray L2 which is transmitted through dome cover 101 traveling below optical axis CBM. As a result of this, the positions of focal points F1 and F2 are deviated from each other. Therefore, as indicated by an one-dot chain line in FIG. 16B, images overlap each other as in the case of double vision and blurring occurs, which results in a decrease in image quality. Note that, in a case where center P1 of semispherical dome cover 101 and rotation center P2 of lens unit 103 are disposed to be deviated (offset) from each other as illustrated in FIG. 17, a problem as described above occurs for light rays transmitted through the semispherical portion also since the light rays are different from each other in transmission angle.

Camera device 10A according to the first exemplary embodiment of the invention includes supporting member 32 which can rotate around first rotation shaft 31 which is orthogonal to top surface 11 in main body 20 which is attached to top surface 11. Camera unit 40 which can rotate around second rotation shaft 35 which is orthogonal to first rotation shaft 31 is attached to supporting member 32. Light shielding plate unit 50A is attached to camera unit 40. Light shielding plate unit 50A can select the covering state in which a portion of the front of lens 41 of camera unit 40 is covered by light shielding plates 51A and 52A and the withdrawal state in which light shielding plates 51A and 52A are withdrawn from the front of lens 41.

Camera unit 40 and light shielding plate unit 50A are covered by light transmitting cover 23.

Here, as illustrated in FIG. 3, cover 23 has a shape in which transmission angle θA1 of a portion above optical axis CBM of camera unit 40 and transmission angle θA2 of a portion below optical axis CBM become different from each other when camera unit 40 rotates around second rotation shaft 35. Here, for example, cover 23 has a semispherical shape.

Therefore, light shielding plate unit 50A is provided with the pair of light shielding plates 51A and 52A which can individually rotate around third rotation shaft 44 which is parallel to second rotation shaft 35 and light shielding plate unit 50A is provided with third motor 55 and fourth motor 56 which rotates the pair of light shielding plates 51A and 52A around third rotation shaft 44.

Accordingly, when third motor 55 and fourth motor 56 appropriately move light shielding plates 51A and 52A, the pair of light shielding plates 51A and 52A can block a light ray travelling above optical axis CBM of camera unit 40 and a light ray travelling below optical axis CBM of camera unit 40, respectively.

Figure 8A:
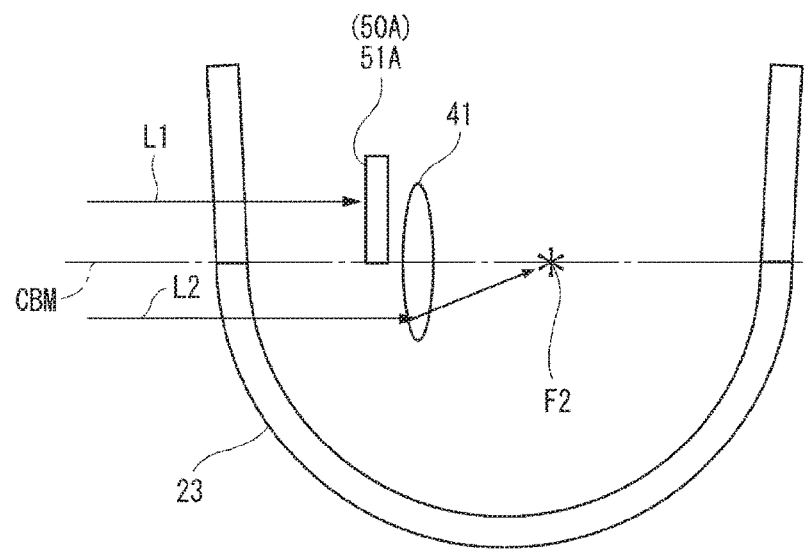
FIG. 8A is a schematic sectional view illustrating image formation in a case where a light ray above an optical axis is blocked.

That is, as illustrated in FIG. 8A, it is possible to block light ray L1 travelling above optical axis CBM using light shielding plate 51A.

Figure 8B:
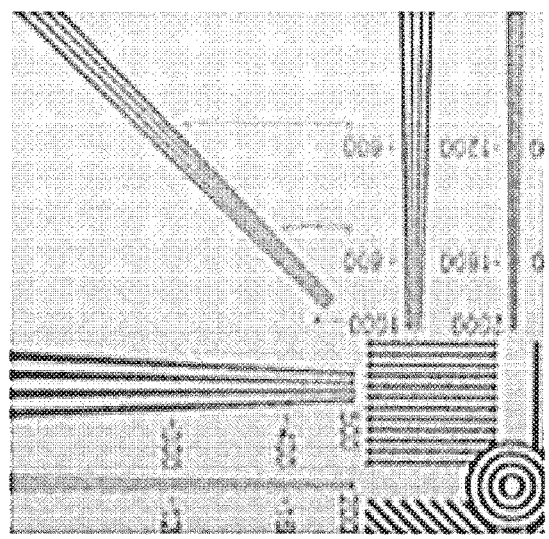
FIG. 8B is an explanatory diagram for explaining the state of an image formed according to FIG. 8A.

As a result of this, only light ray L2 traveling below optical axis CBM can be incident on lens 41. Therefore, one of images which overlap each other as shown in FIG. 8B can be blocked and it is possible to improve the image quality.

Note that, the same operation and effect can be obtained by blocking light ray L2 traveling below optical axis CBM using light shielding plate 52A.

Second Exemplary Embodiment

Next, a camera device and a camera device control method according to a second exemplary embodiment of the invention will be described.

Note that, the same reference numerals are given to the same portions as those in camera device 10A according to the above-described first exemplary embodiment, and repetitive descriptions thereof will be omitted.

Figure 9A:
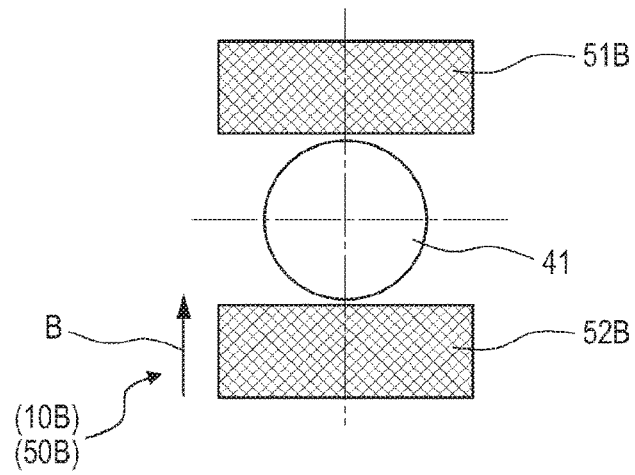
FIG. 9A is a front view illustrating light shielding plates of a camera device according to a second exemplary embodiment of the invention which are in a withdrawal position.
Figure 9B:
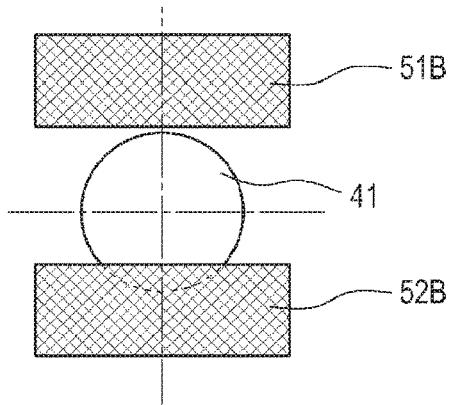
FIG. 9B is a front view illustrating a state where a lower light shielding plate has been rotated.
Figure 9C:
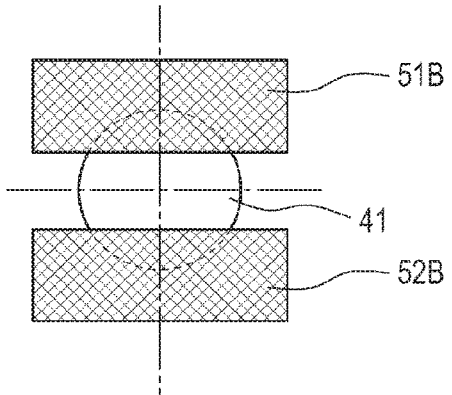
FIG. 9C is a front view illustrating the light shielding plates which are in a covering state.

As illustrated in FIGS. 9A to 9C, in light shielding plate unit 50B of camera device 10B according to the second exemplary embodiment, light shielding plate 51B and light shielding plate 52B individually rotate in a light shielding plate unit step. Since light shielding plate 51B and light shielding plate 52B are individually controlled, it is preferable that a starting point sensor (not shown) for controlling the position of light shielding plate 52B is provided.

As illustrated in FIG. 9A, first, lower light shielding plate 52B in the withdrawal state is rotated upward (refer to an arrow B in FIG. 9A) to achieve the covering state.

When lower light shielding plate 52B is rotated to a predetermined position and a lower portion of lens 41 is covered by lower light shielding plate 52B as illustrated in FIG. 9B, upper light shielding plate 51B is rotated downward.

As a result of this, as illustrated in FIG. 9C, an upper portion and the lower portion of lens 41 enters the covering state and a central portion (a portion other than the upper portion and the lower portion) of lens 41 does not enter the covering state. In this case, the central portion with a wide imaging area can be incident on the imaging element and it is possible to prevent the image from being excessively dark.

Note that, in the covering state, it is also possible to cover different regions (area) for the upper portion and the lower portion of lens 41 in the light shielding plate unit step.

Figure 10:
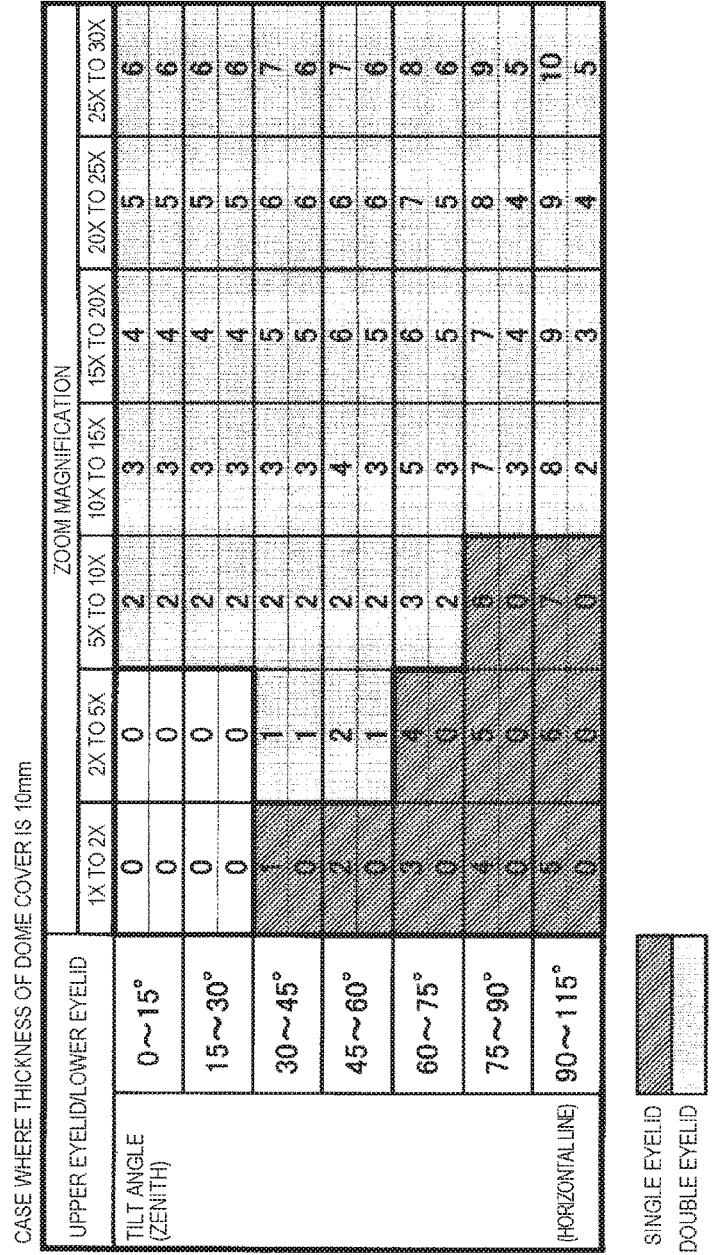
FIG. 10 is a table showing an example of the insertion amounts of upper and lower light shielding plates according to a tilt angle and a zoom magnification.

FIG. 10 is a table showing an example of the insertion amounts of the upper and lower light shielding plates according to the tilt angle and the zoom magnification. Specifically, as illustrated in FIG. 10, light shielding ranges of light shielding plates 51B and 52B are changed according to the tilt angle and the zoom magnification of camera unit 40. This is an example of the light shielding ranges of the light shielding plates 51B and 52B in a case of a so called explosion proof dome in which the dome cover has a thickness of 10 mm which is large. For example, in a case where the tilt angle is close to the zenith (0 degrees to 15 degrees) and the zoom magnification is equal to or less than 5×, light shielding plates 51B and 52B are withdrawn so as not to enter the covering state. However, in a case where the tilt angle is close to the zenith and the zoom magnification is larger than 5×, light shielding plates 51B and 52B are inserted to achieve the covering state. In addition, when the tilt angle is close to the horizontal line (75 degrees to 90 degrees) and the zoom magnification is equal to or less than 5×, only upper light shielding plate 51B is inserted to enter the covering state and lower light shielding plate 52B is withdrawn so as not to enter the covering state. As described above, by withdrawing one light shielding plate so as not to enter the covering state and inserting the other light shielding plate to enter the covering state or by inserting both light shielding plates to enter the covering state depending on the tilt angle and the zoom magnification, it is possible to change the light shielding rate and to capture an optimal image for various imaging areas of the camera device.

In addition, even for the same zoom magnifications, it is possible to change the range covered by upper light shielding plate 51B and lower light shielding plate 52B depending on the tilt angle. For example, as illustrated in FIG. 10, when the zoom magnification is 10× to 15×, if the tilt angle is close to the zenith (0 degrees to 15 degrees), the light shielding ranges of light shielding plates 51B and 52B are the same. However, if the tilt angle is close to the horizontal line (75 degrees to 90 degrees), the light shielding range of light shielding plate 51B is larger than the light shielding range of light shielding plate 52B.

Camera device 10B according to the second exemplary embodiment described above can obtain the same effect as camera device 10A of the first exemplary embodiment.

Furthermore, in a case where camera unit 40 is rotated around second rotation shaft 35 180 degrees, the upper portion of lens 41 can enter the covering state.

Third Exemplary Embodiment

Next, a camera device and a camera device control method according to a third exemplary embodiment of the invention will be described.

Note that, the same reference numerals are given to the same portions as those in camera device 10A according to the above-described first exemplary embodiment and camera device 10B according to the above-described second exemplary embodiment, and repetitive descriptions thereof will be omitted.

Figure 11:
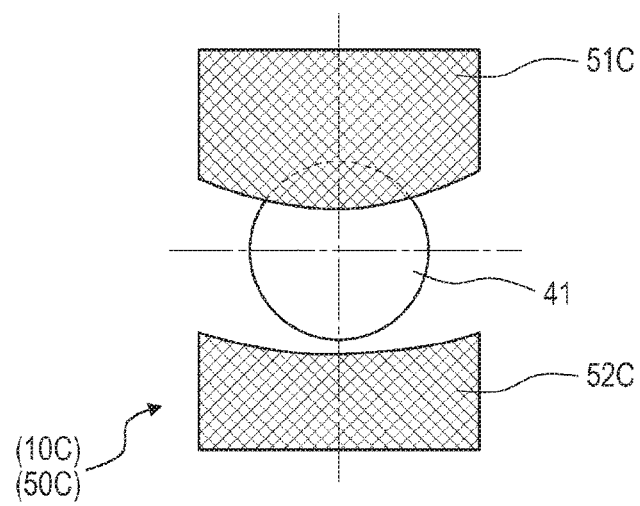
FIG. 11 is a front view illustrating light shielding plates of a camera device according to a third exemplary embodiment of the invention.

As illustrated in FIG. 11, in light shielding plate unit 50C in camera device 10C according to the third exemplary embodiment of the invention, a lower end portion of upper light shielding plate 51C has an arc-like convex shape which curves downward. In addition, an upper end portion of lower light shielding plate 52C has an arc-like concave shape which curves downward.

Regarding a method of rotating upper light shielding plate 51C and lower light shielding plate 52C, as with light shielding plates 51A and 52A in the first exemplary embodiment which is described above, upper light shielding plate 51C and lower light shielding plate 52C can be moved being synchronized each other. Alternatively, as with light shielding plates 51B and 52B in the second exemplary embodiment which is described above, lower light shielding plate 52C can be rotated upward after upper light shielding plate 51C is rotated to a predetermined position and upper light shielding plate 51C covers the upper portion of lens 41.

Note that, the shapes of upper light shielding plate 51C and lower light shielding plate 52C may be replaced with each other. That is, the lower end portion of upper light shielding plate 51C may have an arc-like concave shape which curves upward and the upper end portion of lower light shielding plate 52C may have an arc-like convex shape which curves upward.

Camera device 10C according to the third exemplary embodiment described above can obtain the same effect as camera device 10A of the first exemplary embodiment.

Furthermore, since it is possible to cover areas with different shapes for the upper portion of lens 41 and the lower portion of lens 41, it is possible to obtain an optimal image according to the subject and to improve the surveillance ability.

The camera device in the invention is not limited to the exemplary embodiments described above, and appropriate modifications, improvements and the like are possible.

For example, in the exemplary embodiments described above, a case in which the upper and lower portions of lens 41 are covered by a pair of light shielding plates 51A (51B, 51C) and 52A (52B, 52C) has been described. In addition, in a case where the image quality is deteriorated due to the horizontal end portions (the left and right end portions) of lens 41, the left and right end portions of lens 41 may be covered by the light shielding plate which rotates horizontally.

In addition, in the exemplary embodiments described above, a case in which second rotation shaft 35 which is the rotation center of camera unit 40 is offset downward from center CP of semispherical cover 23 as illustrated in FIG. 3 has been described.

In addition to this, the invention also can be applied to a case where second rotation shaft 35 is offset upward from center CP and a case where second rotation shaft 35 is offset horizontally (a right and left direction in FIG. 3) from center CP.

Figure 12:
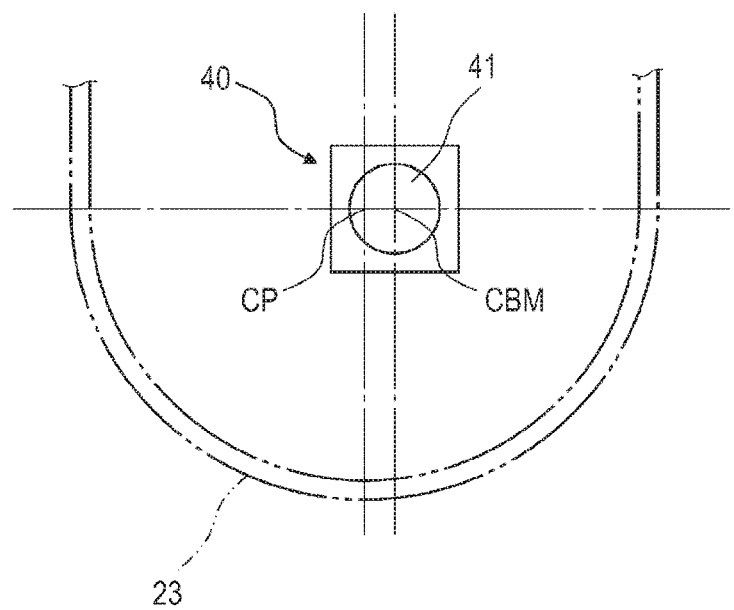
FIG. 12 is a front view illustrating a state where a second rotation shaft is offset from a center of a cover in a horizontal direction.

In addition, the invention also can be applied to a case where optical axis CBM of camera unit 40 is offset horizontally (a right and left direction in FIG. 11) from center CP as illustrated in FIG. 12.

In addition, in the exemplary embodiments described above, a case in which semispherical cover 23 is provided and second rotation shaft 35 is offset downward from center CP of cover 23 has been described. However, the invention can be applied to a case of another shape.

Figure 13A:
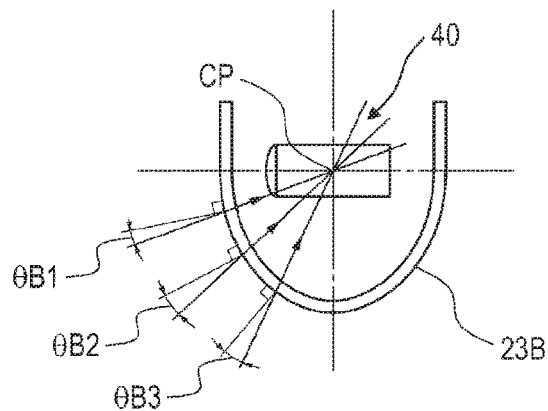
FIG. 13A is a sectional view illustrating a case where the cover has a semielliptical shape.

For example, in a case where elliptical cover 23B is provided as illustrated in FIG. 13A, since transmission angles θB1, θB2, and θB3 of cover 23B are different from each other, the invention can be applied thereto.

Figure 13B:
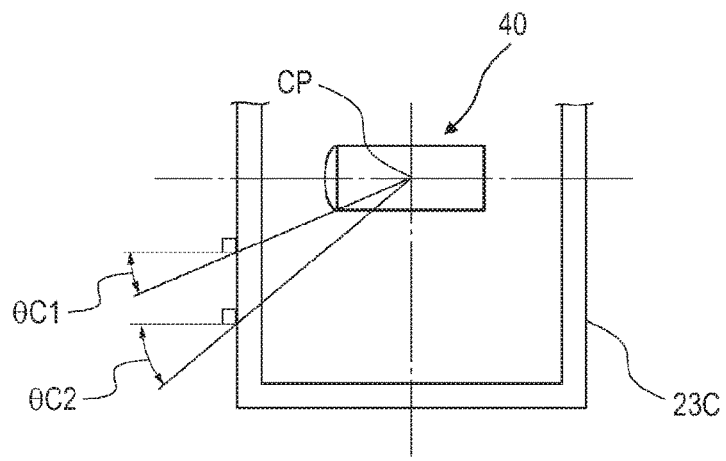
FIG. 13B is a sectional view illustrating a case where the cover has a cylindrical shape.

In addition, in a case where cylindrical cover 23C is provided as illustrated in FIG. 13B, since transmission angles θC1 and θC2 of cover 23C are different from each other, the invention can be applied thereto.

Figure 14A:
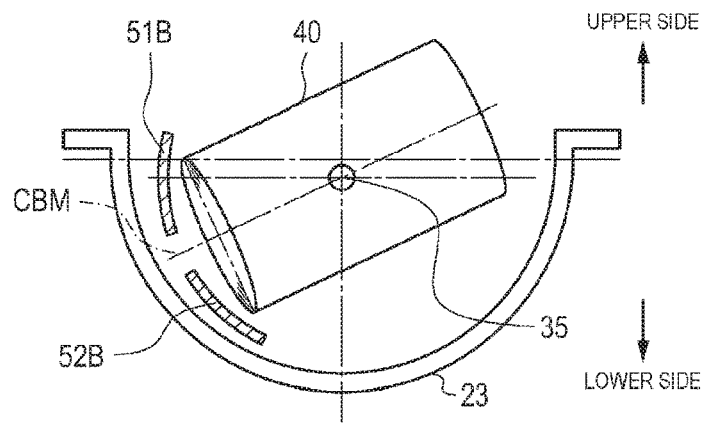
FIG. 14A is an explanatory diagram illustrating a state where there is offset and a light shielding unit blocks light with the zoom magnification being set for a telescopic mode.
Figure 14B:
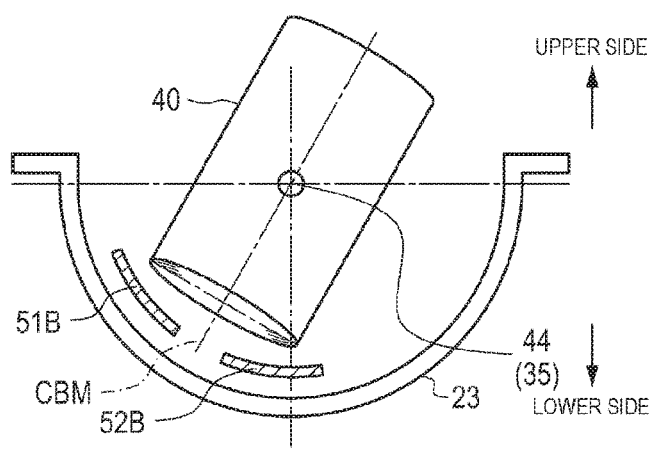
FIG. 14B is an explanatory diagram illustrating a state where there is no offset and the light shielding unit blocks light with the zoom magnification being set for the telescopic mode.

In addition, as illustrated in FIGS. 14A and 14B, second rotation shaft 35 of camera unit 40 may be capable of freely moving downward from center CP of cover 23. For example, in a case where the camera unit is caused to face the zenith direction, second rotation shaft 35 is positioned in the position of center CP of cover 23 and in a case where the camera unit is caused to face the horizontal direction, second rotation shaft 35 is moved to a position below center CP of cover 23 so that vignetting does not occur in a captured image. However, in an explosion proof dome in which the thickness of cover 23 is large, the image quality is deteriorated when second rotation shaft 35 is moved downward. Therefore, in some cases, a user prefers that second rotation shaft 35 is not offset. Accordingly, it is preferable that the light shielding ranges of light shielding plates 51B and 52B are changed depending on the presence or absence of offset also. For example, in a case where there is offset as illustrated in FIG. 14A, if camera unit 40 faces the horizontal direction, the light shielding range of light shielding plate 51B is set to be larger than the light shielding range of light shielding plate 52B. However, in a case where there is no offset as illustrated in FIG. 14B, the same light shielding range is set for light shielding plates 51B and 52B.

Figure 14C:
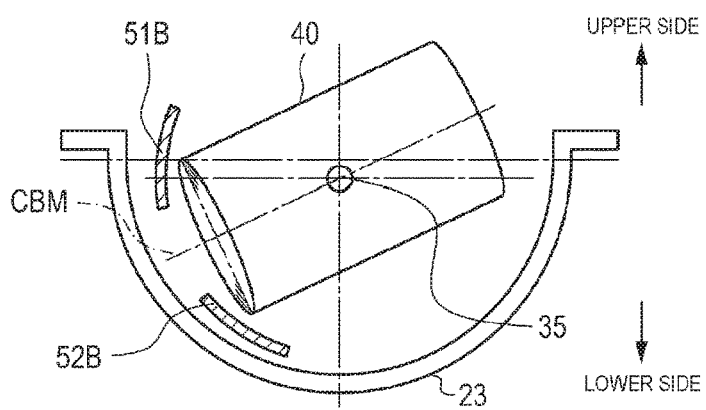
FIG. 14C is an explanatory diagram illustrating a state where there is offset and the light shielding unit blocks light with the zoom magnification being set for a wide angle mode.

Therefore, it is possible to capture an optimum image for various imaging environments. Note that, as with the second exemplary embodiment, as illustrated in FIGS. 14A and 14C, it is preferable that the light shielding ranges of light shielding plates 51B and 52B are changed according to the zoom magnification also. Note that, in a case where the cover has a shape in which a transmission angle on one side of the optical axis of the camera unit and a transmission angle on the other side of the optical axis are different from each other as in the case of above-described elliptical cover 23B and cylindrical cover 23C, the invention also can be applied to a case where the second rotation shaft is not offset from the center of the cover.

Note that, the light shielding plates in each exemplary embodiment can be controlled using a controller or the like on the outside (remote location) of the camera device.

INDUSTRIAL APPLICABILITY

The invention can be applied to a camera device which has a function of rotating in a panning direction and a tilting direction and which is covered by a light transmitting cover and a camera device control method.

REFERENCE MARKS IN THE DRAWINGS 10A, 10B, 10C camera device
11 top surface (attachment surface)
20 main body
21 base
22 accommodation portion
221 opening
23, 23B, 23C cover
30 internal mechanism
31 first rotation shaft
32 supporting member
321 top plate
322A, 322B side plate
33 gear unit
34 first motor
341 rotation shaft
342 gear
35 second rotation shaft
36 gear unit
37 second motor
371 rotation shaft
372 gear
40 camera unit
41 lens
42 cylindrical body
43 imaging element
44 third rotation shaft
50A, 50B, 50C light shielding plate unit
51A, 51B, 51C (upper) light shielding plate
52A, 52B, 52C (lower) light shielding plate
53, 54 supporting plate
531, 541 long hole
532, 542 gear
55 third motor (light shielding plate driving unit)
56 fourth motor (light shielding plate driving unit)
57 starting point sensor
60 signal processing unit
62 I/F unit
64 control unit
66 memory unit
70 controller (PC)
72 operation unit
74 control unit
76 I/F unit
78 monitor
100 dome type camera
101 dome cover
102 camera lens
103 lens unit
104 partial light shielding filter
105 guiding unit
106 supporting piece
107 guiding pin
108 guiding plate
109 long hole
CBM optical axis
CP center
θA1, θA2, θB1, θB2, θB3, θC1, θC2 transmission angle

The invention claimed is:

1. A camera device comprising:
a light transmitting cover;
a rotatable camera provided in the cover;
a plurality of light shielding plates, each of which is movable and blocks a portion of light incident on the rotatable camera; and
a controller that controls the plurality of light shielding plates,
wherein the controller changes a light shielding range of each of the plurality of light shielding plates according to a tilt angle of the rotatable camera.

2. The camera device of claim 1,
wherein the cover has a spherical shape.

3. The camera device of claim 1,
wherein the plurality of light shielding plates are arranged in a vertical direction with respect to an optical axis of the rotatable camera.

4. The camera device of claim 1,
wherein the plurality of light shielding plates are arc-shaped.

5. A camera device comprising:
a light transmitting cover;
a rotatable camera provided in the cover;
a first light shielding plate and a second light shielding plate, each of which is movable and blocks a portion of light incident on the rotatable camera; and
a controller that controls positions of the light shielding plate and the second light shielding plate,
wherein the controller sets light shielding ranges of the first light shielding plate and the second light shielding plate to be substantially the same when a tilt angle of the rotatable camera is close to a zenith direction and sets a light shielding range of an upper light shielding plate, of the first and second light shielding plates, to be larger than a light shielding range of a lower light shielding plate, of the first and second light shielding plates, when the tilt angle of the rotatable camera is close to a horizontal direction.

6. The camera device of claim 5,
wherein the rotatable camera is rotatable in a tilting direction and an axis of the rotation in the tilting direction is offset from a spherical center of the cover in the zenith direction.

7. The camera device of claim 5,
wherein the cover has a spherical shape.

8. The camera device of claim 5,
wherein the first and second light shielding plates are arranged in a vertical direction with respect to an optical axis of the rotatable camera.

9. The camera device of claim 5,
wherein the first and second light shielding plates are arc-shaped.

10. A camera device control method comprising:
controlling positions of a plurality of light shielding plates, each of which is movable and blocks a portion of light incident on a rotatable camera provided in a light transmitting cover; and
changing a light shielding range of each of the plurality of light shielding plates according to a tilt angle of the rotatable camera.

11. A camera device control method comprising:
controlling positions of a first light shielding plate and a second light shielding plate, each of which is movable and blocks a portion of light incident on a rotatable camera provided in a light transmitting cover; and
setting light shielding ranges of the first light shielding plate and the second light shielding plate to be substantially the same when a tilt angle of the camera is close to a zenith direction and setting a light shielding range of an upper light shielding plate, of the first and second light shielding plates, to be larger than a light shielding range of a lower light shielding plate, of the first and second light shielding plates, when the tilt angle of the rotatable camera is close to a horizontal direction.

\* \* \* \* \*